(12) United States Patent
Neal et al.

(10) Patent No.: US 10,553,548 B2
(45) Date of Patent: Feb. 4, 2020

(54) METHODS OF FORMING MULTI-CHIP PACKAGE STRUCTURES

(71) Applicant: Intel Corporation, Santa Clara, CA (US)

(72) Inventors: Nicholas Neal, Gilbert, AZ (US); Nicholas S. Haehn, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/635,555

(22) Filed: Jun. 28, 2017

(65) Prior Publication Data

US 2019/0006291 A1   Jan. 3, 2019

(51) Int. Cl.
| | |
|---|---|
| *H01L 23/00* | (2006.01) |
| *H01L 23/31* | (2006.01) |
| *H01L 23/18* | (2006.01) |
| *H01L 23/373* | (2006.01) |
| *H01L 23/367* | (2006.01) |
| *H01L 25/065* | (2006.01) |
| *H01L 25/00* | (2006.01) |
| *H01L 21/48* | (2006.01) |
| *H01L 21/56* | (2006.01) |

(52) U.S. Cl.
CPC ........ *H01L 23/562* (2013.01); *H01L 21/4853* (2013.01); *H01L 21/4882* (2013.01); *H01L 21/565* (2013.01); *H01L 23/18* (2013.01); *H01L 23/3114* (2013.01); *H01L 23/3675* (2013.01); *H01L 23/373* (2013.01); *H01L 25/0655* (2013.01); *H01L 25/50* (2013.01); *H01L 24/16* (2013.01); *H01L 2224/16227* (2013.01)

(58) Field of Classification Search
CPC ............. H01L 21/4853; H01L 21/4882; H01L 21/565; H01L 23/562; H01L 23/18; H01L 23/3114; H01L 23/3675; H01L 23/373; H01L 24/16; H01L 25/0655; H01L 25/50; H01L 2224/16227
See application file for complete search history.

(56) References Cited

U.S. PATENT DOCUMENTS

| | | | | |
|---|---|---|---|---|
| 8,063,482 | B2 * | 11/2011 | Lu | ........................... H01L 23/04 257/678 |
| 9,576,942 | B1 * | 2/2017 | Karhade | .................. H01L 25/18 |
| 9,620,430 | B2 * | 4/2017 | Lu | ........................ H01L 23/3135 |
| 2008/0001268 | A1 * | 1/2008 | Lu | ........................ H01L 21/6836 257/678 |
| 2013/0187258 | A1 * | 7/2013 | Lu | ........................ H01L 23/3135 257/621 |

(Continued)

*Primary Examiner* — Jay C Chang
(74) *Attorney, Agent, or Firm* — Green, Howard & Mughal LLP.

(57) ABSTRACT

Methods of forming microelectronic package structures/modules, and structures formed thereby, are described. Structures formed herein may include a first die disposed on a substrate, a second die disposed on the substrate, a molding compound disposed between the first die and the second die, wherein the molding compound is disposed on a top surface of the substrate. An epoxy material is disposed between a top portion of a sidewall of the first die and the molding compound, and a thermal interface material (TIM) is disposed on top surfaces of the first and second die, wherein the TIM extends over the entire length of the substrate.

8 Claims, 9 Drawing Sheets

(56) References Cited

U.S. PATENT DOCUMENTS

| | | | |
|---|---|---|---|
| 2013/0273694 A1* | 10/2013 | Hsieh | H01L 23/427 438/113 |
| 2015/0303174 A1* | 10/2015 | Yu | H01L 25/0657 257/712 |
| 2017/0092634 A1* | 3/2017 | Yu | H01L 25/18 |
| 2017/0213809 A1* | 7/2017 | Lu | H01L 23/3135 |
| 2017/0365581 A1* | 12/2017 | Yu | H01L 25/0655 |
| 2018/0005919 A1* | 1/2018 | Chen | H01L 21/561 |

* cited by examiner

METHODS OF FORMING MULTI-CHIP PACKAGE STRUCTURES

BACKGROUND

Microelectronic package structures may utilize multiple die configurations, wherein more than one die may be included in a package. Die within such a package may have varying heights. Thermal interface material (TIM) is typically applied between the back sides of die within the package and a cooling structure, such as a heat spreader, for example, Thermal challenges may arise, such as induced stress of the TIM at die to die boundary regions, for packages with varying die height.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1:
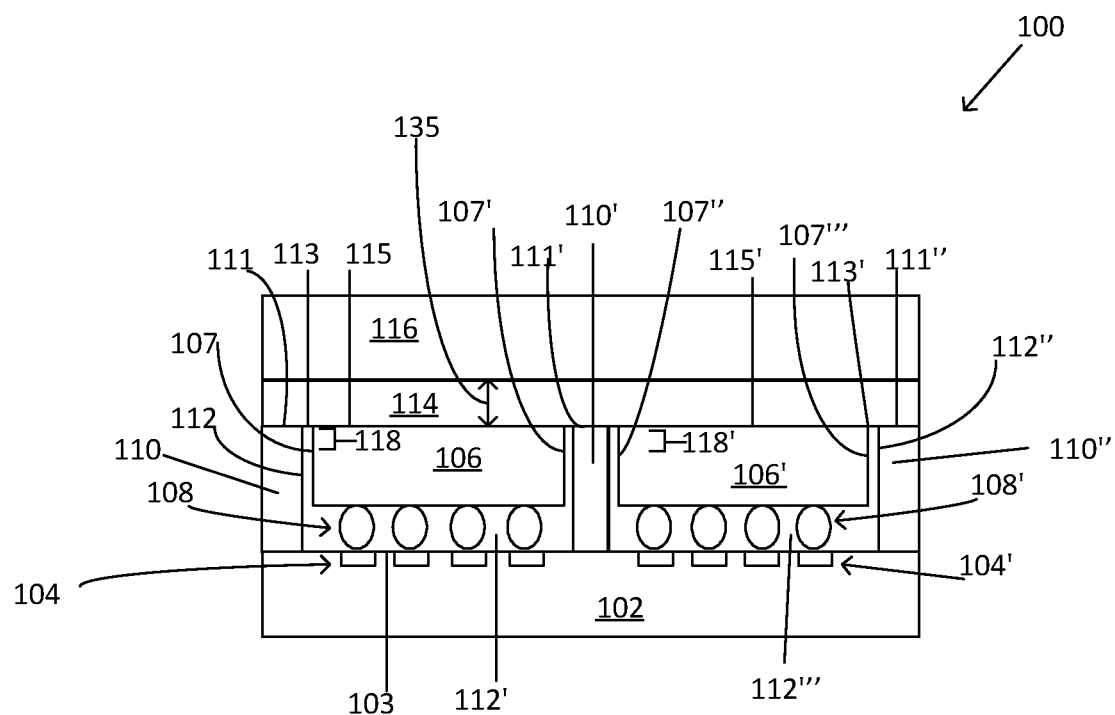
FIG. 1 represents a cross-sectional view of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between an electrical component, such a an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die may include a front-side and an opposing back-side. In some embodiments, the front-side may be referred to as the "active surface" of the die. A number of interconnects may extend from the die's front-side to the underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some one embodiment, a die may be disposed on a substrate in a flip-chip arrangement. In an embodiment interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be disposed on the terminals of the substrate and/or die, and these terminals may then be joined using a solder reflow process. Of course, it should be understood that many other types of interconnects and materials are possible (e.g., wirebonds extending between a die and substrate). In some embodiments herein, a die may be coupled with a substrate by a number of interconnects in a flip-chip arrangement. However, in other embodiments, alternative structures and/or methods may be utilized to couple a die with a substrate.

Embodiments of methods of forming packaging structures, including methods of forming planarized multichip package structures, are described. Those methods/structures may include a package structure comprising a first die disposed on a substrate, a second die disposed on the substrate, a molding compound disposed between the first die and the second die, wherein the molding compound is disposed on a top surface of the substrate. An epoxy material is disposed between a top portion of a sidewall of the first die and the molding compound, and a thermal interface material (TIM) is disposed on top surfaces of the first and second die, wherein the TIM extends over the entire length of the substrate. The embodiments herein enable improved TIM thermal characteristics while reducing the keep out zone region.

The Figures herein illustrate embodiments of fabricating package structures/modules comprising a TIM of uniform thickness. FIG. 1 depicts a package structure 100 that may be fabricated according to embodiments included herein. The package structure 100 may comprise a multichip package structure 100, in an embodiment. A substrate 102 may comprise any suitable package substrate. The substrate 102 may comprise an array of contact structures 104. The contact structures 104 may comprise conductive material, such as solder and/or metallic materials. A first die 106 and a second die 106' may be disposed adjacent one another on a top surface 103 of the substrate 102. The first and second die 106, 106' may comprise any type of microelectronic device/functionality, including devices comprising wireless capabilities, such as but not limited to a microprocessor, a graphics processor, a signal processor, a network processor, a chipset, memory devices, platform controller hub (PCH), DRAM memory, graphics processing unit (GPU) and/or field programmable gate array (FPGA) devices, for example. etc.

In one embodiment, any number of die may be attached to the substrate. In an embodiment, the die 106, 106' may each comprise a system on a chip (SOC) having multiple functional units (e.g., one or more processing units, one or more graphics units, one or more communications units, one or more signal processing units, one or more security units, etc.). However, it should be understood that the disclosed embodiments are not limited to any particular type or class of die/devices.

In an embodiment, the first die 106 and the second die 106' may comprise solder interconnect structures 108, 108', disposed between the die 106, 106' and the substrate 102. In an embodiment, the solder interconnect structures may comprise first level interconnect structures (FLI). The solder interconnect structures 108, 108' may be disposed on and may be physically and electrically coupled to the contact structures 104 disposed on the package substrate 102.

In an embodiment, a first molding pillar 110 may be disposed on the top surface 103 of the substrate 102, adjacent to a first sidewall 107 the first die 106. A second molding pillar 110' may be disposed in a middle portion of the top surface 103 of the substrate 102, adjacent a second sidewall 107' of the first die 106. The second molding pillar 110' may be disposed between the first die 106 and the second die 106'. A third molding pillar 110" may be disposed on the top surface 103 of the substrate 102, adjacent a second sidewall 107'" of the second die 106'. The molding material 110 may comprise such materials as polyimide resin materials, filler materials, and epoxy molding compounds (EMC), for example. The molding pillars 110, 110', 110" may comprise a wall of molding compound surrounding the die 106, 106', and may appear as such depending upon the cross-sectional view.

In an embodiment, an epoxy material surrounding the first die 106 may comprise a first portion 112 and a second portion 112', and may comprise such material as epoxy underfill materials including organic polymers and inorganic fillers. In an embodiment, the epoxy material comprises a different material, in some cases physically and/or chemically different, than the molding material 110 of the pillars. For example, physical properties such as melting temperature may be different between the molding material 110 and the epoxy/underfill material 112, 112'. In an embodiment, the first portion 112 of the epoxy material may comprise a portion of the epoxy material that extends between the first sidewall 107 of the first die 106 and the first pillar 110, and between the second sidewall 107' and the second molding pillar 110'.

In an embodiment, the first portion 112 of the epoxy material may be directly disposed on top portions 118 of the first and second sidewalls 107 of the first die 106, wherein the first portions of the epoxy material 112 may comprise portions of the epoxy material that are farthest away from the top surface 103 of the substrate 102. Similarly, first portions 112" of the epoxy material disposed around the second die 106' may be disposed between the second and third molding pillars 110', 110" and the first and second sidewalls 107", 107'" respectively, and may be directly disposed on top portions 118' of the sidewalls 107", 107'" in an embodiment. Second portions 112', 112'" of the epoxy material may be disposed around the solder interconnect structures 108, 108' of the first and second dies 106, 106' respectively.

Top surfaces 111, 111', 111' of the first, second and third molding pillars 110, 110', 110" and top surfaces 115, 115' of the first and second dies 106, 106' may be substantially coplanar with each other. The top surfaces 113, 113' of the first portions of the epoxy material 112, 112" may share a common plane with top surfaces of the molding pillars 111, 111', 111" and with the top surfaces 115, 115' of the die 106, 106', such that the package structure 100 comprises a substantially planar top surface. In an embodiment, a TIM 114 may be disposed on the top surface of the package structure 100, such as on the planarized top surfaces of the molding pillars, the die and the epoxy material.

The TIM 114 may extend over the entire length of the substrate 102, in an embodiment. The TIM 114 may further comprise a substantially uniform thickness 135, wherein a thickness 135 variation across the TIM 114 may comprise less than about 5 percent, and in some cases may be less than about 2 percent thickness 135 variation. In an embodiment, a cooling solution 116, such as an integrated heat spreader, for example, may be disposed on a top surface of the TIM 114. In an embodiment, the TIM 114 may extend across the entire bottom surface of the cooling solution 116.

Figure 2A:
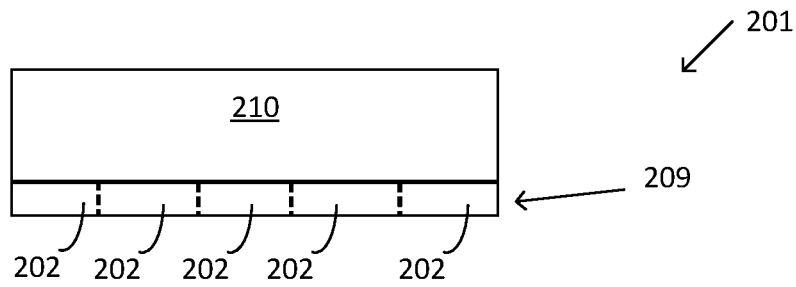
FIGS. 2a-2i represent cross-sectional views of structures formed according to methods of forming package structures according to embodiments.

FIGS. 2a-2g depict cross-sectional views of embodiments of methods of fabricating package structures, such as the package structure of FIG. 1, according to embodiments. In FIG. 2a, a portion of a panel structure 201 is depicted, wherein a panel 209 may comprise segments, wherein each segment comprises individual substrates 202. The individual substrates 202 may be subsequently singulated into separate substrates. A molding compound 210 may be formed on the panel 201. The molding compound 210 may comprise such materials as epoxy molding compounds (EMC).

Figure 2B:
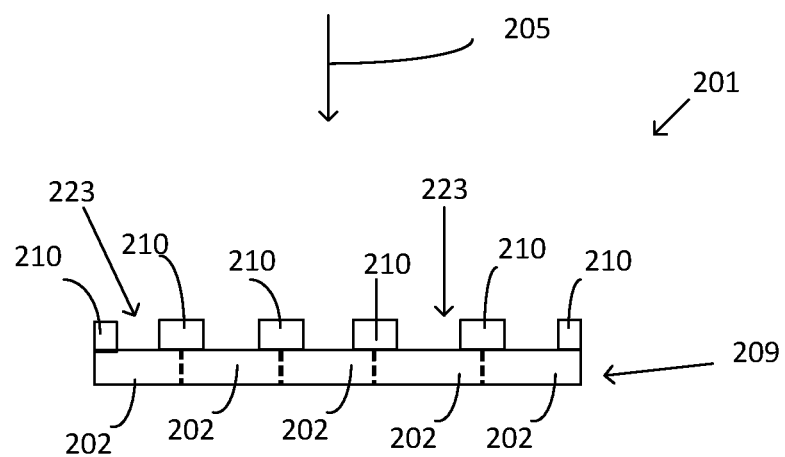

In an embodiment, the molding material 110 may be formed over the entire panel structure 201. In an embodiment, the molding compound 210 may be patterned such that openings 223 may be formed over portions of the individual substrates 202 by using a lithographic and/or etching process 205 (FIG. 2b). In one embodiment, the openings 223 may be formed/patterned by using a mask, such as by using a blocking mask, prior to the formation of the mold compound 210 onto the panel 209, such that the openings are exposed subsequent to the removal of the blocking mask from the panel structure 201. In another embodiment, the mold compound 210 may be patterned using lithographic/etching techniques to form the openings 223, after the formation of the mold compound 210 onto the substrate panel 209.

Figure 2C:
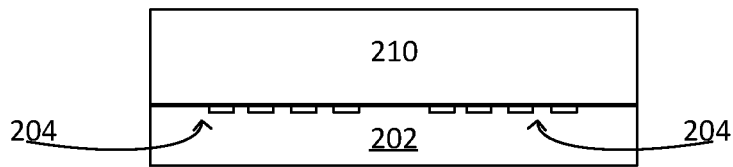
Figure 2D:
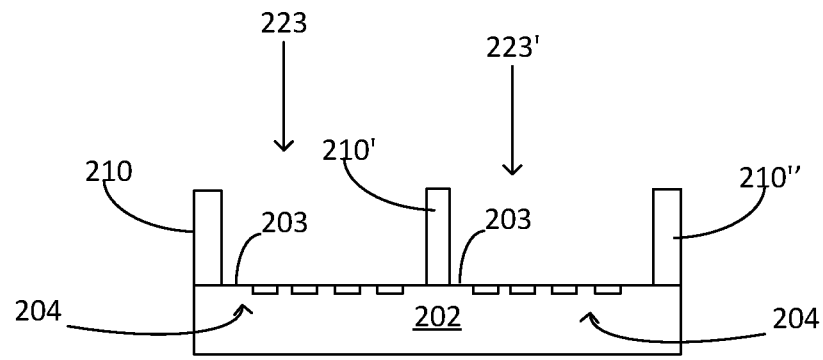

FIG. 2c depicts the molding compound 210 disposed on a single substrate 202 of the panel 201, prior to the formation of the openings 223, and FIG. 2d depicts a single substrate 202 subsequent to the formation of the openings 223, 223' in the molding compound 210. In an embodiment, the panel 209 may be singulated into separate substrates 202 after the formation of the openings 223. The opening 223 may comprise a first opening 223, and the opening 223' may comprise a second opening 223', in an embodiment. The substrate 202 may include a first pillar structure 210, a second pillar structure 210', and a third pillar structure 210" that may be formed on a top surface 203 of the substrate 202, adjacent one another. In an embodiment, the first, second and third pillar structures 210, 210', 210" comprise portions of the molding compound disposed around the openings 223, 223'.

Figure 2E:
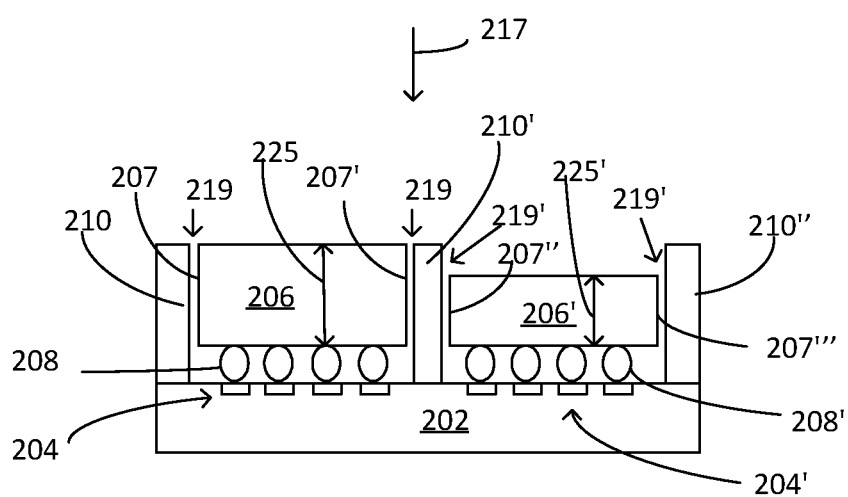

A first die 206 and a second die 206' may be attached/placed onto the top surface 203 of the substrate 202 within openings 223, 223' respectively, by utilizing a die attach process 217 (FIG. 2e). Either or both of the die 206, 206' may including devices comprising wireless capabilities, such as but not limited to a microprocessor, a graphics processor, a signal processor, a network processor, a chipset, etc. In one embodiment, the die 206, 206' may comprise a system on a chip (SOC) having multiple functional units (e.g., one or more processing units, one or more graphics units, one or more communications units, one or more signal processing units, one or more security units, etc.). However, it should be understood that the disclosed embodiments are not limited to any particular type or class of die/devices. In an embodiment, more than one die may be placed on the substrate 202.

The first die 206 may be placed within the first opening 223, and the second die 206' may be placed within a second opening 223'. The first die 206 may comprise a first sidewall 207 and a second sidewall 207', in an embodiment, and the second die 206' may comprise a first sidewall 207" and a second sidewall 207''' in an embodiment. The first die 206 may comprise a height 225, and the second die 206' may comprise a height 225'. In an embodiment, the heights 225, 225' of the first and second die 206, 206', may be different from each other. For example, the first height 225 of the first die 206 may be greater than a height 225' of the second die 206', as depicted in FIG.2e.

The first die 206 may comprise solder interconnect structures 208, such as solder balls, 208, which may be electrically and physically coupled with the substrate 202, and may be physically and electrically coupled to interconnect structures 204 disposed on the substrate 202. The second die 206 may comprise solder interconnect structures 208' which may be electrically and physically coupled with the substrate 202, and may be physically and electrically coupled to interconnect structures 204' disposed on the substrate 202. In an embodiment, the solder interconnect structures 208, 208' may comprise ball grid array structures. The second pillar structure 210' may be disposed between the first die 206 and the second die 206'. A gap 219, may exist between the sidewalls 207, 207' of the first die and the first and second pillar structures 210, 210' respectively, and a gap 219' may exist between sidewalls 207", 207''' of the second die 206' respectively.

Figure 2F:
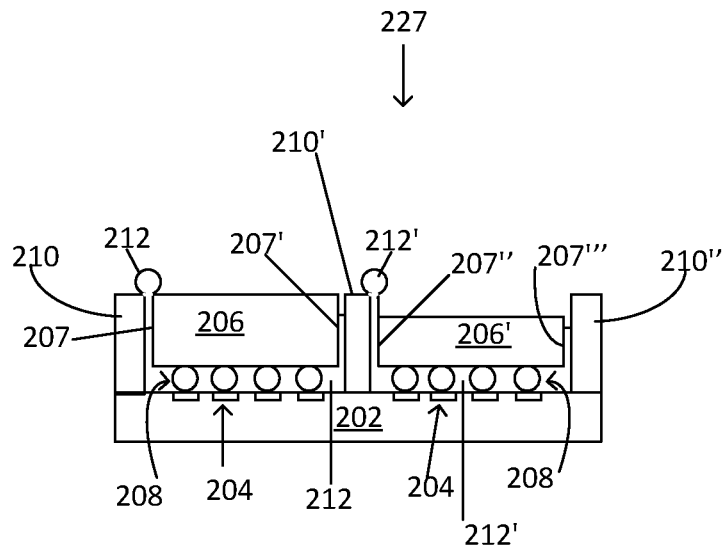

An epoxy material 212 may be formed within the gaps 219 and within the gaps 219' between the sidewalls of the first and second die 206, 206' respectively (FIG. 2f). The epoxy material 212, 212' may comprise such materials as underfill materials, and may comprise a different chemical composition than the molding compound material 210. In an embodiment, the epoxy material 212, 212' may be formed utilizing a capillary underfill process 227. The capillary process 227 causes the epoxy material 212, 212' to be pulled down around the first and second die 206, 206' solder interconnect structures 208, 208', due to the thin boundary between the die sidewalls and the mold pillars. In an embodiment, the epoxy material 212, 212' may completely surround the die interconnect structures 208, 208' of the first and second die 206, 206'. In an embodiment, the epoxy material 212, 212' may extend between the sidewalls of the die 206, 206' and the first, the second and the third pillar structures 210, 210', 210". In an embodiment, a portion of the epoxy material 212 may be formed to surround the first plurality of interconnect structures 208, and a portion of the epoxy material 212' may be formed to surround the second plurality of interconnect structures 208'.

Figure 2G:
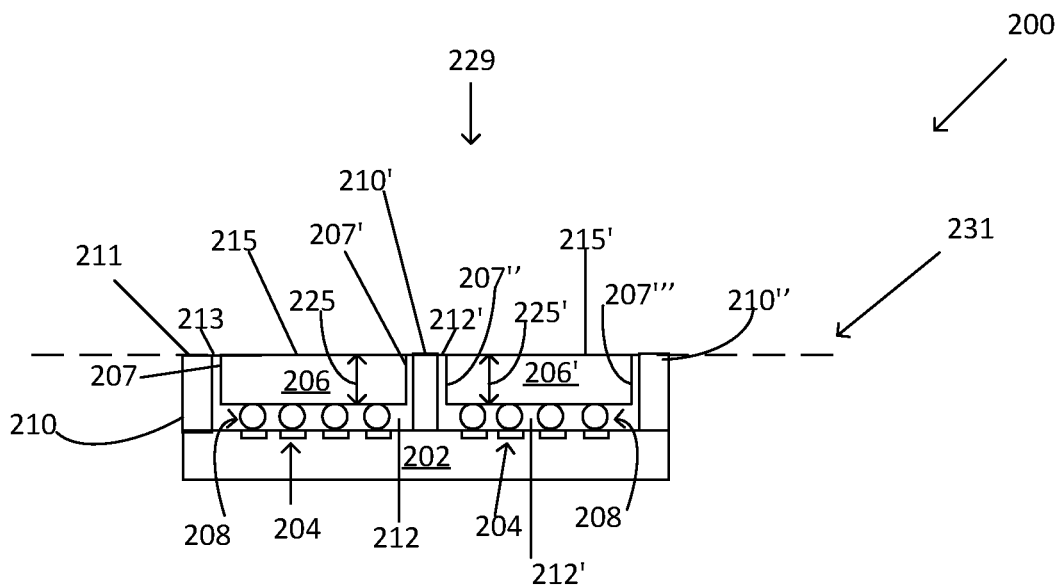

A grinding process 229 may be applied to top surfaces 211 of the pillar structures 210, 210', 210", top surfaces 213 of the epoxy material 212, 212', and top surfaces (back sides of the die) 215, 215' of the die 206, 206' (FIG. 2g). The grinding process 229 may be applied to planarize the top surfaces 211, 213, 215 of the package structure 200. The grinding process 229 may comprise any suitable chemical/physical grinding process/tools which may accomplish the planarization of the top surfaces of the package structure 200. In an embodiment, the top surfaces 211, 213, 215 may be planarized to share a common plane, such as plane 231, for example, with each other. In an embodiment, subsequent to the grinding process 229 application, the top surfaces 211, 213, 215 may be coplanar with each other. In an embodiment, the first and second die 206, 206', may be planarized to comprise substantially equal heights 225, 225'. The grinding process 229 serves to remove keep out zones that might otherwise be necessary on the substrate 202 top surface, in an embodiment.

Figure 2H:
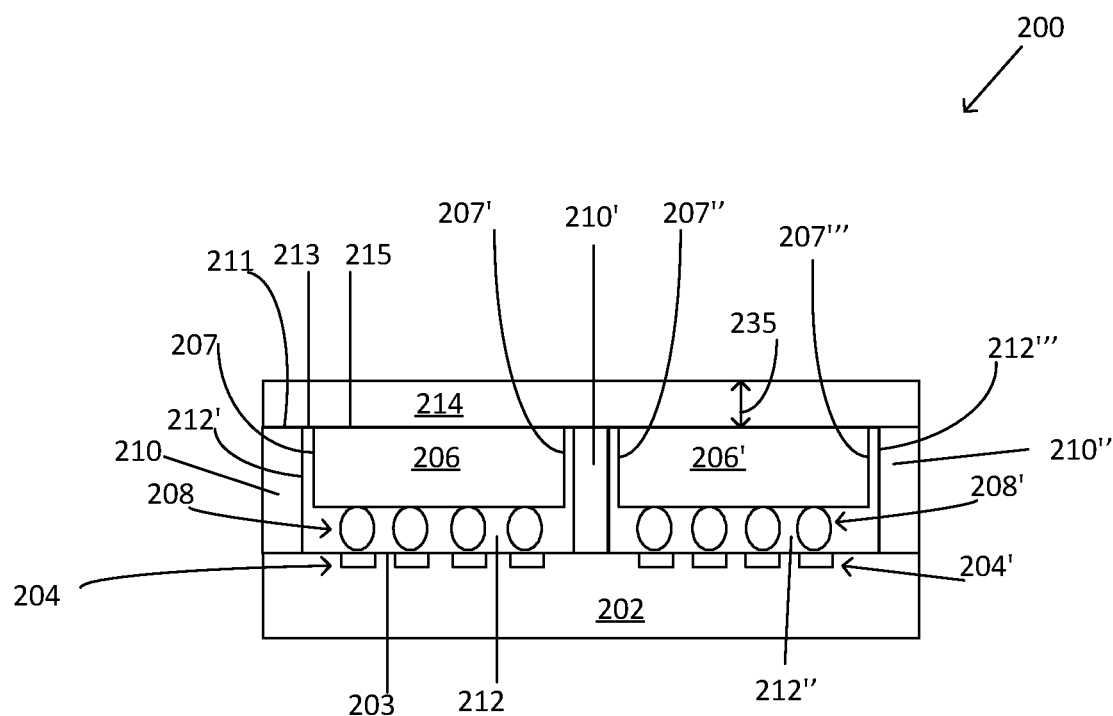

A thermal interface material (TIM) 214 may be attached to the planar top surface of the package structure 200 (FIG. 2h). The TIM 214 may comprise a material that serves to provide thermal conductivity between the die 206, 206' and a cooling solution, such as a heat spreader, for example, that may be subsequently applied to a top surface of the TIM 214. In an embodiment, the TIM 214 may comprise a polymer material, or any other suitable material depending upon the particular design requirements. By planarizing the top surfaces of the package substrate 200 prior to the application of the TIM 214, the TIM 214 may be applied so that it comprises a substantially uniform thickness 235, and the TIM 214 does not need to be adjusted in thickness 235 for varying die heights within the package 200.

The TIM 214 may serve to thermally couple the die 206, 206' with a cooling solution, and may comprise any suitable thermally conductive material capable of forming a thermally conductive (and perhaps mechanical) bond between the backsides of the die 206, 206' and a cooling solution. For example, the TIM layer 214 may comprise a solder material, a composite material, a thermally conductive polymer, as well as any combination of these and/or other materials. Because the TIM 214 covers/extends over the entire substrate 202, the TIM 214 is not prone to squeezing out at die corners, as in some prior art package structures. Thus, the embodiments herein increase performance and reliability of the package structure 200.

Figure 2I:
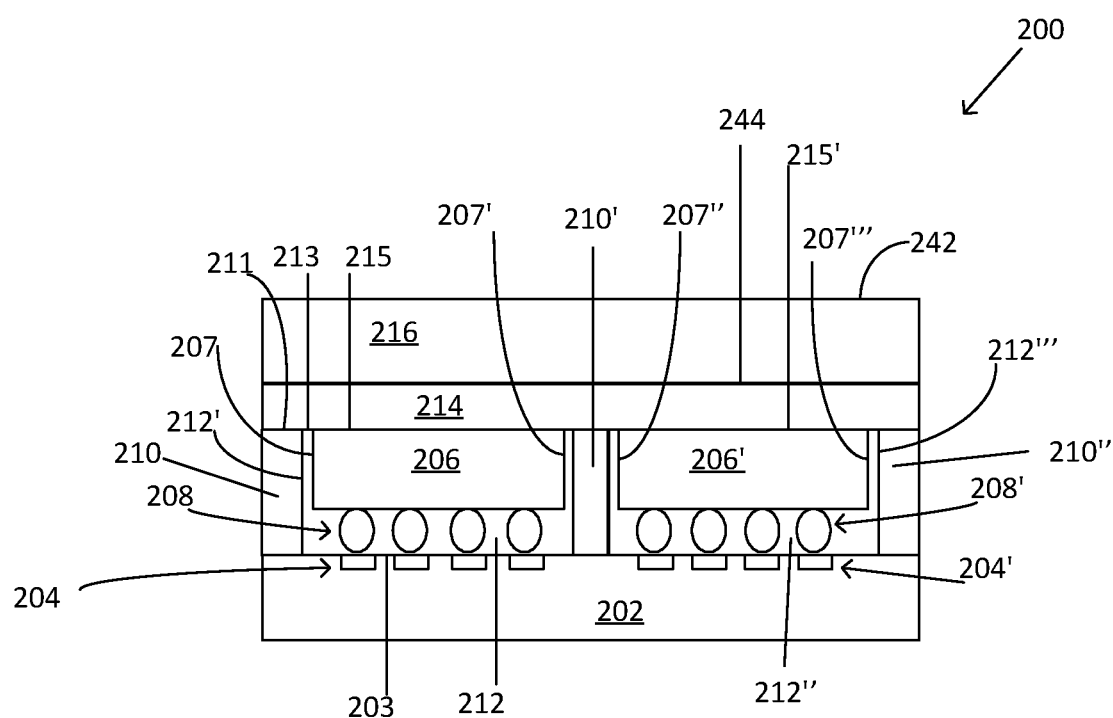

In FIG. 2i, a cooling solution 216 may be applied to a top surface of the TIM 214. In one embodiment, the heat spreader or lid 216 may comprise a first surface 242 and an opposing second surface 244 that faces back surfaces 215, 215' of the die 206, 216' (wherein active surfaces of the die comprising transistors and other such devices/structures are disposed on the interconnect structures 208, 208'). The cooling solution 216 is disposed over the die 206, 206' and is thermally coupled with, and is mechanically coupled with the back surfaces 215, 215' of the die 206, 206' by the layer of TIM 214. Although not shown in FIG.2i, in a further embodiment, a heat sink (or other cooling device) may be thermally coupled with the cooling solution 216, and another layer of a thermal interface material may be disposed between the cooling solution's first surface 242 and the heat sink (or other device). By way of example, the heat sink may comprise a multi-fin (or multi-pin) heat sink secured over the cooling solution 216 and die 206, 206' by a retention mechanism.

The heat spreader 216 may be comprised of any suitable thermally conductive materials and may have any suitable shape or structure. According to one embodiment, the cooling solution 216 may comprise an integrated heat spreader, or IHS. Materials that may be used to construct the cooling solution 216 include metals (e.g., copper and alloys thereof), thermally conductive composites, and thermally conductive polymers. In one embodiment, a wetting layer (e.g., nickel) or other coating may be disposed over at least a portion of the heat spreader's surface.

The various embodiments of the package assemblies/interconnect structures describe packaging structures which provide a single plane for top surface of all dies within a multiple die package. By applying a mold layer at the panel substrate level with the die located between the formed mold pillar structures, filling the gap between sidewalls of the die and the mold pillars, and then planarizing the top plane of the package, the TIM may be formed in a substantially uniform thickness. According to embodiments herein the TIM extends across the entire length of the substrate, and thermal properties of the TIM are enhanced, such as a reduction of thermal resistance by enabling a reduced TIM thickness. Reduction of the keep out zone (KOZ) is enabled. Stress within the TIM at corners of the die, as well as stresses due to die to die interfaces, are significantly removed by incorporating the structures and methods described herein. By forming a planarized top surface of the package structure, a uniform TIM thickness is formed, wherein stress due to die height differences is greatly reduced, and thermal properties of the TIM are enhanced. In an embodiment, the TIM extends across the entire bottom surface of the cooling solution, such as an integrated heat spreader.

Figure 3:
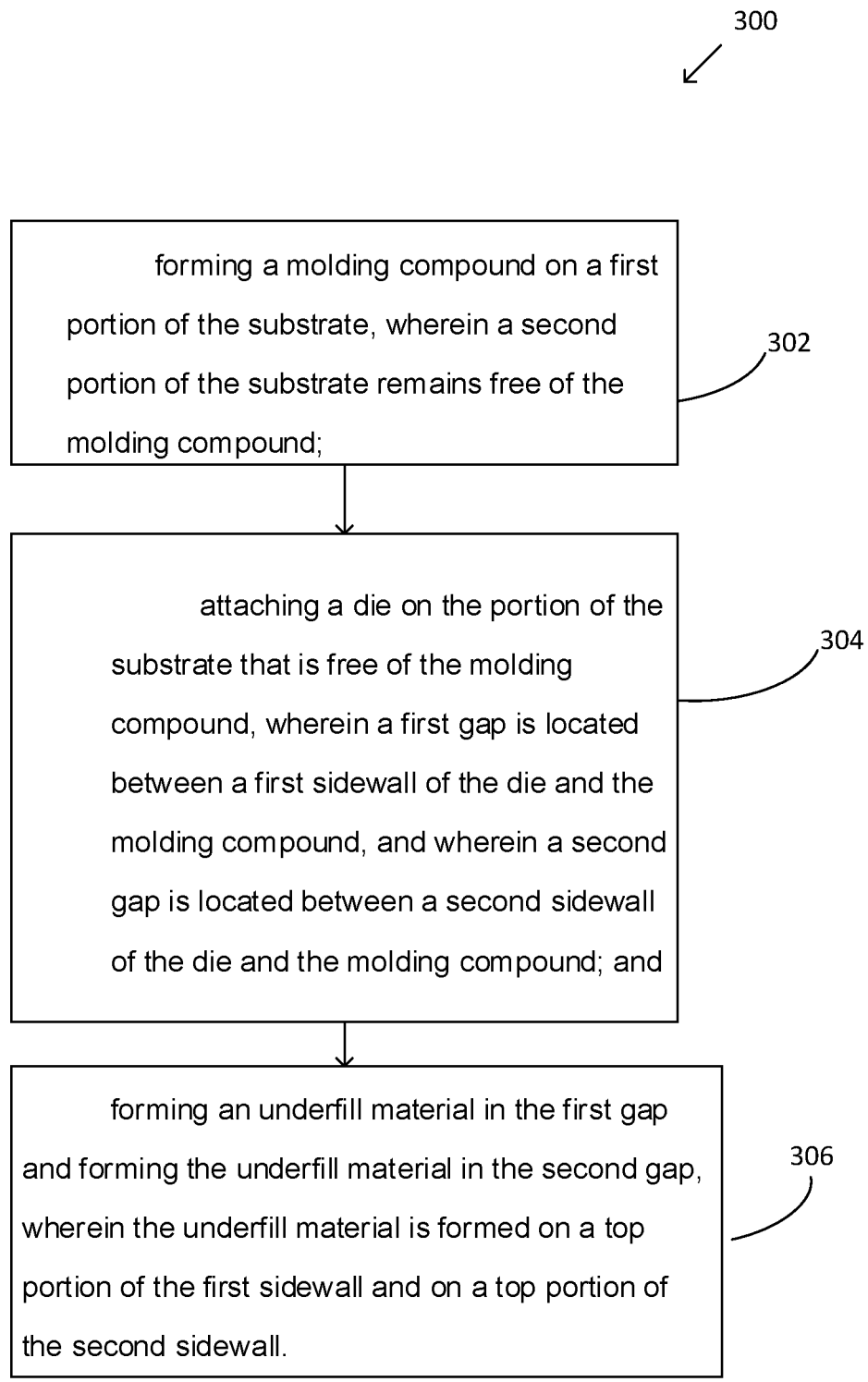
FIG. 3 represents a flowchart of a method of forming package structures according to embodiments.

FIG. 3 depicts a method 300 of forming a package structure according to embodiments herein. At step 302, a molding compound may be formed on a first portion of the substrate, wherein a second portion remains free of the molding compound. The molding compound may be formed on a panel of substrates in a blanket fashion, in an embodiment. The molding compound may then be patterned to form the second portion, or openings, which is free of the molding compound, for subsequent die placement onto the substrate. The molding compound may comprise an EMC, in an embodiment. In an embodiment, the substrate may comprise a portion of a multi-die package structure. At step 304, a die may be attached on the molding free portion of the substrate, wherein a first gap is located between a first sidewall of the die and the molding compound, and wherein a second gap is located between a second sidewall of the die and the molding compound. At step 306, an underfill material may be formed in the first gap and the underfill material may be formed in the second gap.

The underfill material and the molding compound comprise different materials from each other. In an embodiment, the underfill material may be formed in the gap by a capillary underfill process. In an embodiment, a top surface of the package may be planarized, and a TIM may be formed on the top surface. In an embodiment, the TIM may be substantially planar and uniform in thickness, and may extend over the length of the substrate.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the package structures included herein may be used for system on a chip (SOC) products, and may find application in such devices as smart phones, notebooks, tablets, wearable devices and other electronic mobile devices. In various implementations, the package structures may be included in a laptop, a netbook, an ultrabook, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 4:
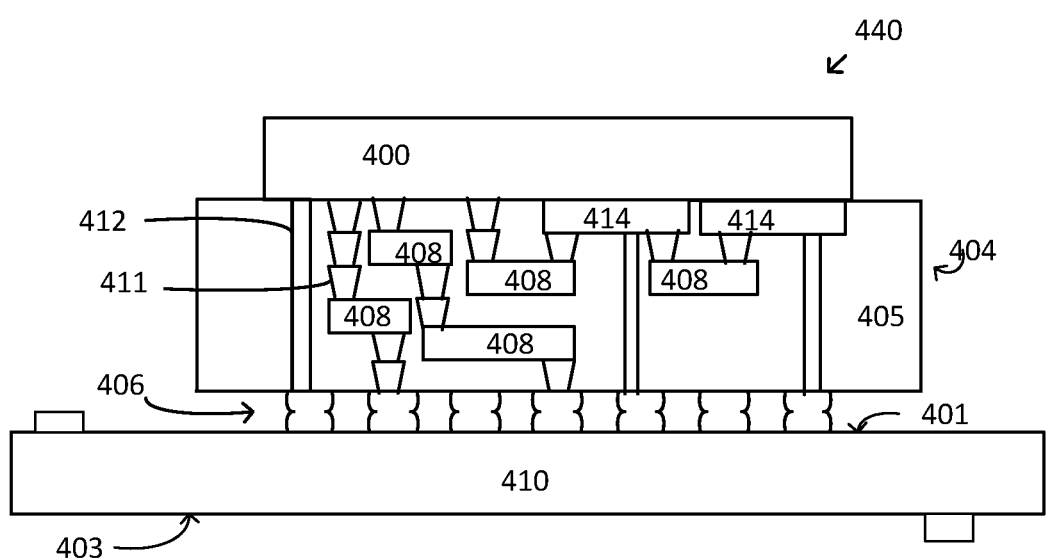
FIG. 4 represents a cross section of a portion of a computing system according to embodiments.

Turning now to FIG. 4, illustrated is a cross sectional view of an embodiment of a computing system 440. The system 440 includes any number of components disposed on a mainboard 410 or other circuit board. Mainboard 410 includes a first side 401 and an opposing second side 403, and various components may be disposed on either one or both of the first and second sides 401, 403. In the illustrated embodiment, the computing system 440 includes a package structure 400 disposed on the mainboard's first side 401, wherein the package structure 400 may comprise any of the package structures described herein according to embodiments, such as the package structure 100 of FIG. 1, for example. System 440 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 410 may comprise any suitable type of circuit board or other substrate capable of providing electrical communication between one or more of the various components disposed on the board. In one embodiment, for example, the mainboard 410 comprises a printed circuit board (PCB). However, it should be understood that the disclosed embodiments are not limited to the above-described PCB and, further, that mainboard 410 may comprise any other suitable substrate.

In an embodiment, a substrate 404, such as an interposer, for example, may be disposed between the package structure 400 and the board 410, and may be physically and electrically coupled with the board by interconnect structures 406. The substrate 404 may comprise multiple metal layers 408, such as layers 408 that may be electrically coupled with vias 411, wherein the metal layers may be separated from one another by a layer(s) of dielectric material, such as dielectric layer 405. The substrate 404 may further comprise conductive through hole vias 412 and conductive pads 414 disposed on one or more surfaces of the substrate 404. In an embodiment, any one or more of the conductive structures 412, 408, 411, 414 may be formed in a desired circuit pattern to route—perhaps in conjunction with other metal layers—electrical signals between the package structure 400 and the board 410. In another embodiment, the package structure 400 may be directly attached/electrically and physically coupled to the mainboard 410, by a substrate included within the package structure 440, such as the substrate 102 of FIG. 1, for example. In addition to the package structure 400, one or more additional components may be disposed on either one or both sides 401, 403 of the mainboard 410.

The additional components may include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices. In one embodiment, the computing system 440 includes a radiation shield. In a further embodiment, the computing system 440 includes a cooling solution, wherein the cooling solution may be disposed on a TIM disposed on a top surface of the package structure 400, such as are depicted in FIG. 1. In yet another embodiment, the computing system 440 includes an antenna. In yet a further embodiment, the assembly 440 may be disposed within a housing or case. Where the mainboard 410 is disposed within a housing, some of the components of computer system 440—e.g., a user interface device, such as a display or keypad, and/or a power supply, such as a battery—may be electrically coupled with the mainboard 410 (and/or a component disposed on this board) but may be mechanically coupled with the housing.

Figure 5:
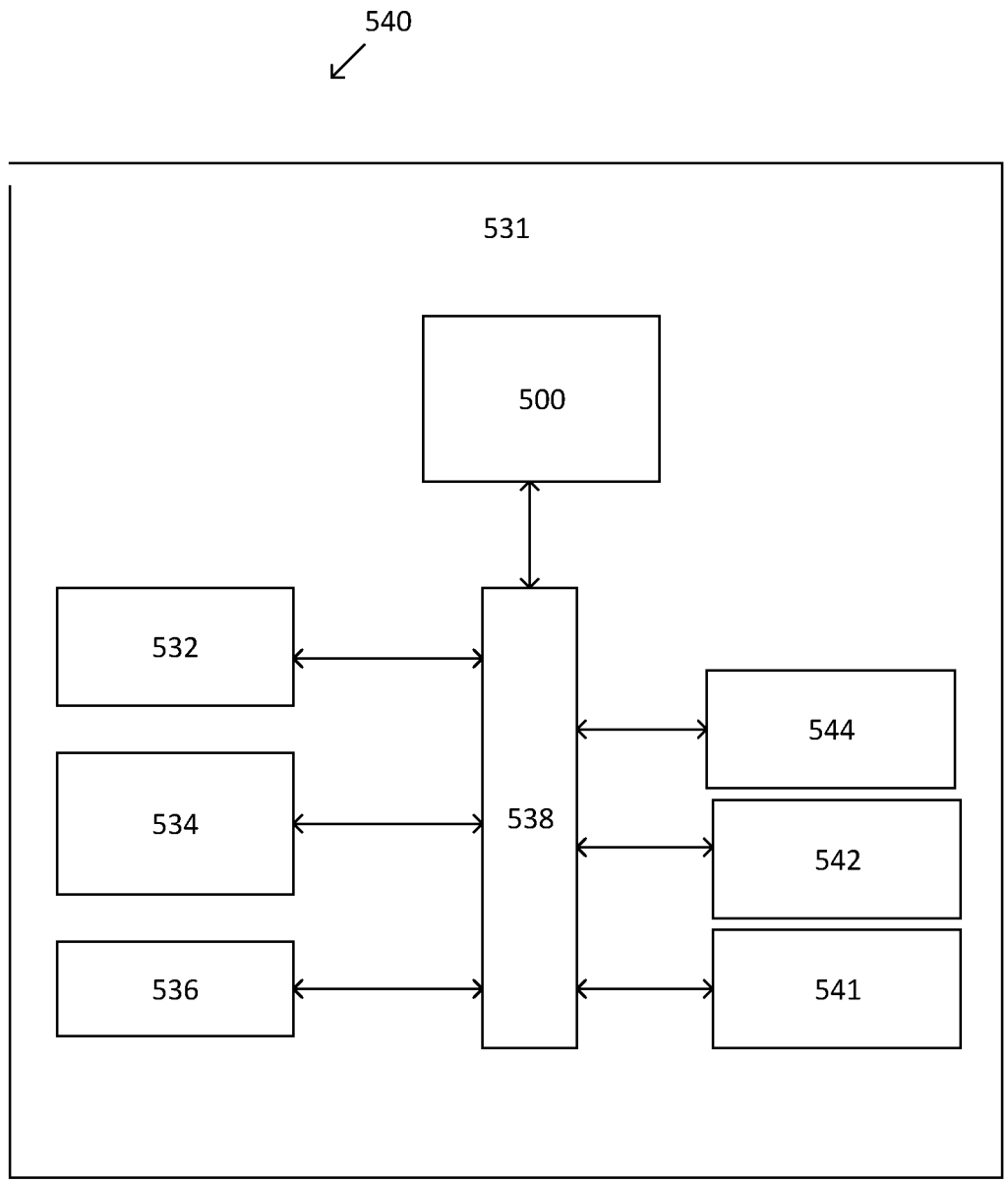
FIG. 5 represents a schematic of a computing system according to embodiments.

Turning now to FIG. 5, illustrated is a schematic of an embodiment of a portion of a computing system 540, including one or more of the package structures 500, fabricated according to any of the embodiments of the package structures included herein, such as package structure 100 of FIG. 1. The package structure 500 may include any or all of the elements of the embodiments included herein, such as wherein a TIM extends uniformily across the entire substrate, as a part of the system 540.

In some embodiments, the system 540 includes a processing means such as one or more processors 532 coupled to one or more buses or interconnects, shown in general as bus 538. The processors 532 may comprise one or more physical processors and one or more logical processors. In some embodiments, the processors may include one or more general-purpose processors or special-processor processors.

The bus 538 may be a communication means for transmission of data. The bus 538 may be a single bus for shown for simplicity, but may represent multiple different interconnects or buses and the component connections to such interconnects or buses may vary. The bus 538 shown in FIG. 5 is an abstraction that represents any one or more separate physical buses, point-to-point connections, or both connected by appropriate bridges, adapters, or controllers. In some embodiments, the system 540 further comprises a random access memory (RAM) or other dynamic storage device or element as a main memory 534 for storing information and instructions to be executed by the processors 532. Main memory 534 may include, but is not limited to, dynamic random access memory (DRAM). The system 540 also may comprise one or more passive devices 536, such as capacitors and inductors that may be installed on a board, such as a printed circuit board 531.

In some embodiments, the system 540 includes one or more transmitters or receivers 541 coupled to the bus 538. In some embodiments, the system 440 may include one or more antennae 544 (internal or external), such as dipole or monopole antennae, for the transmission and reception of data via wireless communication using a wireless transmitter, receiver, or both, and one or more ports 542 for the transmission and reception of data via wired communications. Wireless communication includes, but is not limited to, Wi-Fi, Bluetooth™, near field communication, and other wireless communication standards. In an embodiment an antenna may be included in the module 500.

System 540 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

EXAMPLES

Example 1 is a microelectronic package structure comprising: a die disposed on a substrate, wherein the die comprises a first die; an array of interconnect structures disposed between a bottom surface of the die and a top surface of the substrate; a first portion of an epoxy material disposed on a top portion of a sidewall of the die; a second portion of the epoxy material surrounding the array of interconnect structures; and a molding compound adjacent the first portion and the second portion of the epoxy material, wherein the molding compound is disposed on the top surface of the substrate, and wherein the first portion of the epoxy material is disposed between the molding compound and a top portion of the sidewall of the die.

Example 2 incudes the microelectronic package structure of example 1 wherein a thermal interface material (TIM) is disposed on a top surface of the die.

Example 3 includes the microelectronic package structure of any one of the examples 1-2 wherein a cooling solution is disposed on a top surface of the TIM.

Example 4 includes the microelectronic package structure of any one of examples 1-3 wherein the molding compound comprises an epoxy mold compound.

Example 5 includes the microelectronic package structure of any one of the examples 1-5 wherein the first portion and the second portion of the epoxy material comprises (please add).

Example 6 includes the microelectronic package structure of any of examples 1-6 wherein a top surface of the molding compound, a top surface of the first portion of the epoxy material, and a top surface of the die share a common plane with each other.

Example 7 includes the microelectronic package structure of any of examples 1-6 wherein a second die is disposed on the substrate adjacent the first die.

Example 8 includes the microelectronic package structure of any of examples 1-7 wherein the second die comprises a second plurality of interconnect structures, wherein the second plurality of interconnect structures is surrounded by the epoxy material.

Example 9 is microelectronic package structure comprising a first die disposed on a substrate; a second die disposed on the substrate; a molding compound disposed between the first die and the second die, wherein the molding compound is disposed on a top surface of the substrate; an epoxy material disposed between a top portion of a sidewall of the first die and the molding compound; and a thermal interface material (TIM) disposed on top surfaces of the first and second die, wherein the TIM extends over the entire length of the substrate.

Example 10 includes the microelectronic package structure of example 9 wherein a portion of the epoxy material surrounds a plurality of interconnect structures disposed between the first die and the substrate.

Example 11 includes the microelectronic package structure of any of examples 9-10 wherein the TIM is disposed on a top surface of the epoxy material.

Example 12 includes the microelectronic package structure of any of examples 9-11 wherein the top surfaces of the first die and the second die are coplanar with each other.

Example 13 includes the microelectronic package structure of any of examples 9-12 wherein the TIM is disposed on a top surface of the molding compound.

Example 14 includes the microelectronic package structure of any of examples 9-13 wherein a portion of the epoxy material extends between a top portion of a sidewall of the second die and the molding compound.

Example 15 includes the microelectronic package structure of any of examples 9-14 wherein a top surface of the molding compound, a top surface of the first die, and a top surface of the second die share a common plane.

Example 16 includes the microelectronic package structure of any of examples 9-15, wherein a cooling solution is disposed on a top surface of the TIM.

Example 17 is a method of forming a microelectronic package comprising: forming a molding compound on a first portion of the substrate, wherein a second portion remains free of the molding compound; attaching a die on the molding free portion of the substrate, wherein a first gap is located between a first sidewall of the die and the molding compound, and wherein a second gap is located between a second sidewall of the die and the molding compound; and forming an underfill material in the first gap and forming the underfill material in the second gap.

Example 18 includes the method of example 17 wherein forming the underfill material comprises filling the first gap and filling the second gap with the underfill material by capillary action.

Example 19 incudes the method of any of the examples 17-18 wherein the die comprises a plurality of interconnect structures disposed between the die and the substrate, and wherein forming the epoxy material comprises forming the underfill material around the plurality of interconnect structures.

Example 20 includes the method of example 19 further comprising attaching a second die adjacent the first die, wherein the molding compound is adjacent a first sidewall of the second die.

Example 21 includes the method of example 20 further comprising wherein the molding compound is adjacent a second sidewall of the second die, and the underfill material is disposed in a gap between the first sidewall of the second die and the molding compound.

Example 22 includes the method of example 21 further comprising planarizing the top surfaces of the first die and the second die, planarizing top surfaces of the molding compound, and planarizing top surfaces of the underfill material, wherein the top surfaces of the first and second die share a common plane, by using a grinding process.

Example 23 includes the method of example 22 further comprising forming a thermal interface material (TIM) on the backside of the first die and on the backside of the second die, wherein the TIM extends over the entire length of the substrate.

Example 24 includes the method of example 23 further comprising attaching a cooling solution on a top surface of the TIM.

Example 25 includes the method of any of the examples 17-24 wherein forming the molding compound on a substrate comprises forming the molding compound on a panel of substrates.

Example 26 is a system comprising: a processor for processing data; a memory for storage of data; a transmitter or receiver for transmission and reception of data; and a module coupled to the memory including: a package disposed on a board, wherein the package comprises: a first die disposed on a substrate; a second die disposed on the substrate; a molding compound disposed between the first die and the second die, wherein the molding compound is disposed on a top surface of the substrate; an epoxy material disposed between a top portion of a sidewall of the first die and the molding compound; and a thermal interface material (TIM) disposed on top surfaces of the first and second die, wherein the TIM extends over the entire length of the substrate.

Example 27 includes the system of example 26 wherein a portion of the epoxy material surrounds a plurality of interconnect structures disposed between the first die and the substrate.

Example 28 includes the system of any of the examples 26-27 wherein the TIM is disposed on a top surface of the epoxy material.

Example 29 includes the system of any of examples 26-28 wherein the top surfaces of the first die and the second die are coplanar with each other.

Example 30 includes the system of any of examples 26-29 wherein the TIM is disposed on a top surface of the molding compound.

Example 31 includes the system of any of examples 26-30 wherein a portion of the epoxy material extends between a top portion of a sidewall of the second die and the molding compound.

Example 32 includes the system of any of examples 26-30 wherein a top surface of the molding compound, a top surface of the first die, and a top surface of the second die share a common plane.

Example 33 includes the system of any of examples 26-30, wherein a cooling solution is disposed on a top surface of the TIM.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus, the embodiments are not limited to the structures described herein.

What is claimed is:

1. A microelectronic package structure comprising:
   a first die on a substrate;
   a second die on the substrate adjacent the first die;
   a first portion of an epoxy material on an entire length of a sidewall of the first die and directly on a top surface of the substrate, wherein a first sidewall of the first portion of the epoxy material is opposite a second sidewall of the first portion of the epoxy material, wherein the first sidewall and the second sidewall of the first portion of the epoxy material are parallel to a first sidewall of the first die;
   a second portion of the epoxy material on a sidewall of the second die and directly on the top surface of the substrate;
   a molding compound, wherein a portion of the molding compound is between the first portion and the second portion of the epoxy material and is between the first die and the second die, wherein the portion of the molding compound is directly on the top surface of the substrate, wherein the portion of the molding compound is adjacent a second sidewall of the first die, opposite the first sidewall of the first die,
   wherein a top surface of the portion of the molding compound, a top surface of the first portion of the epoxy material, a top surface of the second portion of the epoxy material, a top surface of the first die and a top surface of the second die share a common plane with each other; and
   a thermal interface material (TIM) directly on the top surface of the portion of the molding compound, directly on the top surfaces of the first portion and the second portion of the epoxy material, and directly on the top surfaces of the first die and the second die.

2. The microelectronic package structure of claim 1 wherein the portion of the molding compound comprises a first portion, and wherein a second portion of the molding compound is adjacent the first sidewall of the first die, wherein a first sidewall of the second portion of the molding compound and a second sidewall, opposite the first sidewall, of the second portion of the molding compound are parallel with the first sidewall of the first die, and wherein the (TIM) is on a top surface of the second portion of the molding compound, wherein the top surface of the second portion of the molding compound is coplanar with the top surface of the first portion of the epoxy material.

3. The microelectronic package structure of claim 1 wherein a cooling solution is on a top surface of the TIM.

4. The microelectronic package structure of claim 1 wherein the molding compound comprises an epoxy molding compound.

5. The microelectronic package structure of claim 1 wherein the epoxy material comprises an underfill material, wherein a third portion of the epoxy material is on an entire length of the second sidewall of the first die wherein sidewalls of the third portion are parallel with the second sidewall of the first die.

6. The microelectronic package structure of claim 1 wherein the sidewall of the second die comprises a first sidewall of the second die, and wherein an additional portion of the molding compound is adjacent a second sidewall, opposite the first sidewall, of the second die, wherein sidewalls of the additional portion of the molding compound are parallel with the second sidewall of the second die, and wherein a top surface of the additional portion of the molding compound is coplanar with a top surface of the third portion of the epoxy material.

7. The microelectronic package structure of claim 6 wherein a width of the top surface of the third portion of the epoxy material and a width of the top surface of the first portion of the epoxy material are substantially equal.

8. The microelectronic package structure of claim 1 wherein a plurality of interconnect structures is beneath the second die, and is surrounded by the epoxy material.

* * * * *